(12) United States Patent
Shibib et al.

(10) Patent No.: US 11,217,541 B2
(45) Date of Patent: Jan. 4, 2022

(54) TRANSISTORS WITH ELECTRICALLY ACTIVE CHIP SEAL RING AND METHODS OF MANUFACTURE

(71) Applicant: Siliconix Incorporated, San Jose, CA (US)

(72) Inventors: M. Ayman Shibib, San Jose, CA (US); Kyle Terrill, San Jose, CA (US)

(73) Assignee: Vishay-Siliconix, LLC, San Jose, CA (US)

( * ) Notice: Subject to any disclaimer, the term of this patent is extended or adjusted under 35 U.S.C. 154(b) by 0 days.

(21) Appl. No.: 16/406,437

(22) Filed: May 8, 2019

(65) Prior Publication Data

US 2020/0357755 A1 Nov. 12, 2020

(51) Int. Cl.
| | |
|---|---|
| *H01L 23/58* | (2006.01) |
| *H01L 29/78* | (2006.01) |
| *H01L 29/08* | (2006.01) |
| *H01L 29/10* | (2006.01) |
| *H01L 29/66* | (2006.01) |

(52) U.S. Cl.
CPC .......... *H01L 23/585* (2013.01); *H01L 29/086* (2013.01); *H01L 29/0878* (2013.01); *H01L 29/1095* (2013.01); *H01L 29/66734* (2013.01); *H01L 29/7811* (2013.01); *H01L 29/7813* (2013.01)

(58) Field of Classification Search
CPC .............. H01L 23/585; H01L 29/0878; H01L 29/66734; H01L 29/1095; H01L 29/7813; H01L 29/7811; H01L 29/086
See application file for complete search history.

(56) References Cited

U.S. PATENT DOCUMENTS

| | | | |
|---|---|---|---|
| 4,710,790 A | 12/1987 | Okamoto et al. |
| 4,881,105 A | 11/1989 | Davari et al. |
| 5,283,201 A | 2/1994 | Tsang et al. |
| 5,321,289 A | 6/1994 | Baba et al. |
| 5,381,105 A | 1/1995 | Phipps |
| 5,477,071 A | 12/1995 | Hamamoto et al. |
| 5,502,320 A | 3/1996 | Yamada |
| 5,614,751 A | 3/1997 | Yilmaz et al. |
| 5,637,898 A | 6/1997 | Baliga |
| 5,668,026 A | 9/1997 | Lin et al. |
| 5,726,463 A | 3/1998 | Brown et al. |

(Continued)

FOREIGN PATENT DOCUMENTS

| | | |
|---|---|---|
| DE | 102005041322 A1 | 3/2007 |
| EP | 0717450 A2 | 6/1996 |

(Continued)

OTHER PUBLICATIONS

Hsu et al., "A Novel Trench Termination Design for 100-V TMBS Diode Application", IEEE Electron Device Letters, vol. 22 No. 11, Nov. 2001, pp. 551-552.

(Continued)

*Primary Examiner* — Syed I Gheyas

(57) ABSTRACT

A transistor and method of manufacturing an electrically active chip seal ring surrounding the gate, gate insulator and source structure of the active core area of the transistor. The chip seal ring can be electrically coupled to the gate to seal the active core area from intrusions of contaminants, impurities, defects and or the like.

10 Claims, 7 Drawing Sheets

(56) References Cited

U.S. PATENT DOCUMENTS

| | | |
|---|---|---|
| 5,763,915 A | 6/1998 | Hshieh et al. |
| 5,864,159 A | 1/1999 | Takahashi |
| 5,877,528 A | 3/1999 | So |
| 5,900,643 A | 5/1999 | Preslar et al. |
| 5,914,503 A | 6/1999 | Iwamuro et al. |
| 5,998,833 A | 12/1999 | Baliga |
| 6,031,265 A | 2/2000 | Hshieh |
| 6,084,264 A | 7/2000 | Darwish |
| 6,114,878 A | 9/2000 | Loughmiller et al. |
| 6,180,426 B1 | 1/2001 | Lin |
| 6,211,549 B1 | 4/2001 | Funaki et al. |
| 6,239,463 B1 * | 5/2001 | Williams ............... H01L 29/165 257/328 |
| 6,242,775 B1 | 6/2001 | Noble |
| 6,255,683 B1 | 7/2001 | Radens et al. |
| 6,281,547 B1 | 8/2001 | So et al. |
| 6,291,298 B1 | 9/2001 | Williams et al. |
| 6,309,929 B1 | 10/2001 | Hsu et al. |
| 6,404,007 B1 | 6/2002 | Mo et al. |
| 6,413,822 B2 | 7/2002 | Williams et al. |
| 6,462,376 B1 | 10/2002 | Wahl et al. |
| 6,489,204 B1 | 12/2002 | Tsui |
| 6,495,884 B2 | 12/2002 | Harada et al. |
| 6,525,315 B1 | 2/2003 | Motoyama |
| 6,548,860 B1 | 4/2003 | Hshieh et al. |
| 6,621,107 B2 | 9/2003 | Blanchard et al. |
| 6,653,691 B2 | 11/2003 | Baliga |
| 6,657,835 B2 | 12/2003 | Ker et al. |
| 6,683,346 B2 | 1/2004 | Zeng |
| 6,707,128 B2 | 3/2004 | Moriguchi et al. |
| 6,781,199 B2 | 8/2004 | Takahashi |
| 6,838,722 B2 | 1/2005 | Bhalla et al. |
| 6,882,000 B2 | 4/2005 | Darwish et al. |
| 6,900,100 B2 | 5/2005 | Williams et al. |
| 6,906,380 B1 | 6/2005 | Pattanayak et al. |
| 6,921,697 B2 | 7/2005 | Darwish et al. |
| 7,005,347 B1 | 2/2006 | Bhalla et al. |
| 7,009,247 B2 | 3/2006 | Darwish |
| 7,193,912 B2 | 3/2007 | Obara et al. |
| 7,335,946 B1 | 2/2008 | Bhalla et al. |
| 7,345,342 B2 | 3/2008 | Challa et al. |
| 7,385,248 B2 | 6/2008 | Herrick et al. |
| 7,393,749 B2 | 7/2008 | Yilmaz et al. |
| 7,494,876 B1 | 2/2009 | Giles et al. |
| 7,544,571 B2 | 6/2009 | Park |
| 7,598,143 B2 | 10/2009 | Zundel et al. |
| 7,868,381 B1 | 1/2011 | Bhalla et al. |
| 7,936,009 B2 | 5/2011 | Pan et al. |
| 8,247,865 B2 | 8/2012 | Hirler |
| 8,629,505 B2 | 1/2014 | Nishiwaki |
| 8,686,493 B2 | 4/2014 | Thorup et al. |
| 8,704,223 B2 | 4/2014 | Yamagami et al. |
| 2002/0036319 A1 | 3/2002 | Baliga |
| 2002/0056884 A1 | 5/2002 | Baliga |
| 2002/0060340 A1 | 5/2002 | Deboy et al. |
| 2003/0086296 A1 | 5/2003 | Wu et al. |
| 2003/0178676 A1 | 9/2003 | Henninger et al. |
| 2003/0201502 A1 | 10/2003 | Hsieh |
| 2004/0021173 A1 | 2/2004 | Sapp |
| 2004/0038479 A1 | 2/2004 | Hsieh |
| 2004/0084721 A1 | 5/2004 | Kocon et al. |
| 2004/0113202 A1 | 6/2004 | Kocon et al. |
| 2004/0119118 A1 | 6/2004 | Williams et al. |
| 2005/0001268 A1 | 1/2005 | Baliga |
| 2005/0030688 A1 | 2/2005 | Sakihama et al. |
| 2005/0079676 A1 | 4/2005 | Mo et al. |
| 2005/0082591 A1 | 4/2005 | Hirler et al. |
| 2005/0151190 A1 | 7/2005 | Kotek et al. |
| 2005/0167742 A1 | 8/2005 | Challa et al. |
| 2005/0202577 A1 | 9/2005 | Williams et al. |
| 2006/0017056 A1 | 1/2006 | Hirler |
| 2006/0061378 A1 | 3/2006 | Poechmuller |
| 2006/0113577 A1 | 6/2006 | Ohtani |
| 2006/0209887 A1 | 9/2006 | Bhalla et al. |
| 2006/0214221 A1 | 9/2006 | Challa et al. |
| 2006/0273386 A1 | 12/2006 | Yilmaz et al. |
| 2006/0281249 A1 | 12/2006 | Yilmaz et al. |
| 2007/0004116 A1 | 1/2007 | Hshieh |
| 2007/0037327 A1 | 2/2007 | Herrick et al. |
| 2007/0108511 A1 | 5/2007 | Hirler |
| 2007/0108515 A1 | 5/2007 | Hueting et al. |
| 2007/0132014 A1 | 6/2007 | Hueting |
| 2007/0155104 A1 | 7/2007 | Marchant et al. |
| 2007/0221952 A1 | 9/2007 | Thorup et al. |
| 2007/0262305 A1 | 11/2007 | Adkisson et al. |
| 2008/0073707 A1 | 3/2008 | Darwish |
| 2008/0076222 A1 | 3/2008 | Zundel et al. |
| 2008/0135889 A1 | 6/2008 | Session |
| 2008/0166845 A1 | 7/2008 | Darwish |
| 2008/0197407 A1 | 8/2008 | Challa et al. |
| 2008/0199997 A1 | 8/2008 | Grebs et al. |
| 2008/0265289 A1 | 10/2008 | Bhalla et al. |
| 2008/0290367 A1 | 11/2008 | Su et al. |
| 2009/0035900 A1 | 2/2009 | Thorup et al. |
| 2009/0050959 A1 | 2/2009 | Madson |
| 2009/0057756 A1 | 3/2009 | Hshieh |
| 2009/0059999 A1 | 3/2009 | Shoda |
| 2009/0072301 A1 | 3/2009 | Bhalla et al. |
| 2009/0140327 A1 | 6/2009 | Hirao et al. |
| 2009/0162989 A1 | 6/2009 | Hirao et al. |
| 2009/0179829 A1 | 7/2009 | Nakata et al. |
| 2009/0200578 A1 | 8/2009 | Xu |
| 2009/0246923 A1 | 10/2009 | Park |
| 2009/0273026 A1 | 11/2009 | Wilson et al. |
| 2009/0309156 A1 | 12/2009 | Darwish et al. |
| 2010/0006928 A1 | 1/2010 | Pan et al. |
| 2010/0214016 A1 | 8/2010 | Blanchard et al. |
| 2010/0295567 A1 | 11/2010 | Chang |
| 2010/0318313 A1 | 12/2010 | Agarwal et al. |
| 2011/0079843 A1 | 4/2011 | Darwish et al. |
| 2011/0089485 A1 | 4/2011 | Gao et al. |
| 2012/0043602 A1 | 2/2012 | Zeng et al. |
| 2012/0061753 A1 | 3/2012 | Nishiwaki |
| 2012/0267704 A1 | 10/2012 | Siemieniec et al. |
| 2013/0049072 A1 | 2/2013 | Heineck et al. |
| 2013/0147510 A1 | 6/2013 | Huang et al. |
| 2013/0221436 A1 | 8/2013 | Hossain et al. |
| 2013/0238273 A1 | 9/2013 | Tercariol et al. |
| 2014/0264562 A1 * | 9/2014 | Cheng ............... H01L 29/66666 257/330 |
| 2015/0108568 A1 | 4/2015 | Terrill et al. |
| 2015/0221566 A1 | 8/2015 | Ookura |
| 2015/0340433 A1 * | 11/2015 | Tu ..................... H01L 29/0696 257/487 |
| 2017/0262566 A1 | 9/2017 | Chiang et al. |
| 2018/0337171 A1 * | 11/2018 | Losee .................. H01L 23/647 |
| 2018/0374944 A1 | 12/2018 | Anderson et al. |

FOREIGN PATENT DOCUMENTS

| | | |
|---|---|---|
| JP | 63296282 | 2/1988 |
| JP | 03-211885 | 9/1991 |
| JP | 3211885 A | 9/1991 |
| JP | 7045817 A | 2/1995 |
| JP | H07-235676 A | 9/1995 |
| JP | H08-167711 A | 6/1996 |
| JP | 10173175 | 6/1998 |
| JP | 11068102 | 3/1999 |
| JP | 2000223705 A | 8/2000 |
| JP | 2001308327 | 11/2001 |
| JP | 2002110984 | 4/2002 |
| JP | 2003282870 A | 10/2003 |
| JP | 2003309263 | 10/2003 |
| JP | 2004241413 A | 8/2004 |
| JP | 2005032941 | 2/2005 |
| JP | 2005057050 | 3/2005 |
| JP | 2005191221 A | 7/2005 |
| JP | 2006202931 A | 9/2006 |
| JP | 2007529115 A | 10/2007 |
| JP | 2008543046 A | 11/2008 |
| JP | 2008546189 A | 12/2008 |
| JP | 2008546216 A | 12/2008 |
| JP | 2009505403 A | 2/2009 |
| JP | 2009141005 A | 6/2009 |

(56) References Cited

FOREIGN PATENT DOCUMENTS

| | | | |
|---|---|---|---|
| JP | 2009542002 | A | 11/2009 |
| JP | 2010505270 | A | 2/2010 |
| JP | 2011258834 | A | 12/2011 |
| JP | 2012059943 | A | 3/2012 |
| JP | 2013508980 | A | 3/2013 |
| WO | 9403922 | | 2/1994 |
| WO | 0025363 | | 5/2000 |
| WO | 0025365 | | 5/2000 |
| WO | 200042665 | A1 | 7/2000 |
| WO | 200065646 | A | 11/2000 |
| WO | 02099909 | A1 | 12/2002 |
| WO | 2005065385 | A2 | 7/2005 |
| WO | 2006127914 | | 11/2006 |
| WO | 200051167 | | 2/2007 |
| WO | 2007021701 | | 2/2007 |
| WO | 2007129261 | | 11/2007 |
| WO | 2007129261 | A2 | 11/2007 |
| WO | 2009026174 | | 2/2009 |
| WO | 2011050115 | A2 | 4/2011 |

OTHER PUBLICATIONS

K Imai et al., "Decrease in Trenched Surface Oxide Leakage Currents by Rounding Off Oxidation", Extended Abstracts of the 18.sup.th (1986 International) Conference on Solid State Devices and Materials, Tokyo 1986, pp. 303-306.
Y. Baba et al., "High Reliable UMOSFET with Oxide-Nitride Complex Gate Structure" 1997 IEEE, pp. 369-372.

* cited by examiner

440
Forming an integral chip seal ring region in the chip seal ring trench after forming the chip seal ring/body insulator region

445
Forming a plurality of source regions in the body region adjacent the gate regions, wherein source regions are separated from the gate regions by the gate insulator regions and the source regions are separated from the optional drift region or the drain region by a portion of the body region

450
Forming an insulator region over the gate regions, the source regions and the body regions

455
Forming a chip seal ring contact through the insulator region extending around the chip seal ring region and electrically coupled to the chip seal ring region, and gate contacts through the insulator region and electrically coupled to the gate regions

460
Forming a metalization layer over the insulator region and electrically coupled to the chip seal ring contact and the gate contacts

FIG. 4B

TRANSISTORS WITH ELECTRICALLY ACTIVE CHIP SEAL RING AND METHODS OF MANUFACTURE

BACKGROUND OF THE INVENTION

Referring to FIG. 1, a perspective view of an exemplary Metal-Oxide-Semiconductor Field Effect Transistor (MOSFET) according to the conventional art is shown. The MOSFET 100 can include, but is not limited to, one or more source regions 105, one or more gate regions 110, one or more gate insulator regions 115, one or more body regions 120, one or more optional drift regions 125, one or more drain regions 130, one or more drain contacts 135, one or more gate contact/bus regions 140, and one or more bus/body insulator regions 145. Other regions not illustrated can include one or more trace layers, one or more vias, one or more insulator layers, one or more source/body contacts and the like.

In one implementation, a drift region 125 can be disposed between a drain region 130 and the body region 120. A plurality of source regions 105, a plurality of gate regions 110 and a plurality of gate insulator regions 115 can be disposed within the body region 120. The gate regions 110 can be formed as a plurality of parallel elongated structures (e.g., stripped cell structure). The gate insulator region 115 can surround the gate regions 110, separating the gate regions 110 from the source regions 105, the body region 120 and the drift region 125. Thus, the gate regions 110 are electrically isolated from the surrounding source regions 105, body region 120 and drift region 125 by the gate insulator regions 115. The plurality of gate regions 110 can be electrically coupled together by the one or more gate bus regions 140. The source regions 105 can be formed along the periphery of the gate insulator regions 115. The source regions 105 can be separated from the drift region 125 and drain region 130 by the body region 120. The source regions 105 and the body region 120 can be electrically coupled together by one or more source/body contacts (not shown). The drain contact 135 can be disposed on the drain region 130. The one or more gate contact/bus regions 140 can be electrically isolated from the body region 120 by the one or more has/body insulator regions 145. One or more trace layers, one or more vias, and one or more insulator layers (not shown) can be disposed over the gate regions 110, the source regions 105, the body regions 120, the one or more gate bus regions 140.

Although FIG. 1 illustrates a MOSFET with two parallel elongated structures of source regions 105, gate regions 110 and gate insulator regions 115, commonly referred to as cell structures, it is appreciated that implementations of the MOSFET typically include many more such cell structures.

In one implementation, the source regions 105 and the drain region 130 can be heavily n-doped (N+) semiconductor, such as silicon doped with phosphorous or arsenic. The drift region 125 can be lightly n-doped (N−) semiconductor, such as silicon doped with phosphorous or arsenic. The body region 120 can be p-doped (P) semiconductor, such as silicon doped with boron. The gate region 110 can be heavily n-doped (N+) semiconductor, such as polysilicon doped with phosphorous. The gate insulator regions 115 can be an insulator, such as silicon dioxide.

When the potential of the gate regions 110, with respect to the source regions 105, is increased above the threshold voltage of the MOSFET 100, a conducting channel can be induced in the body region 120 along the periphery of the gate insulator regions 115. The MOSFET 100 can then conduct current between the drain region 130 and the source regions 105. Accordingly, the MOSFET 100 is in its ON-state.

When the potential of the gale regions 110 is reduced below the threshold voltage, the channel is no longer induced. As a result, a voltage potential applied between the drain region 130 and the source regions 115 will not cause current to flow there between. Accordingly, the MOSFET 100 is in its OFF-state and the junction formed by the body region 120 and the drain region 130 can support the voltage applied across the source and drain.

The lightly n-doped (N−) drift region 125 results in a depletion region that extends into both the body regions 120 and the drain region 130, thereby reducing the punch through effect. Accordingly, the lightly n-doped (N−) drift region 125 acts to increase the breakdown voltage of the MOSFET 100.

The channel width of the MOSFET 100 is a function of the length of the plurality of the source regions 105 along the periphery of the gate insulator regions 110. The channel length of the MOSFET 100 is a function of the width of the body region 120 between the source regions 105 and the drift region 125 along the periphery of the gale insulator regions 115. Thus, the MOSFET 100 can provide a large channel width to length ratio. Therefore, the MOSFET device 100 may advantageously be utilized for power MOSFET applications, such as switching elements in a pulse width modulation (PWM) voltage regulator.

Typically, a plurality of MOSFET devices 100 are fabricated together on a semiconductor wafer. The MOSFET devices 100 are then separated into individual die in a process referred to as singulation. During the fabrication of the MOSFET devices 100 on the semiconductor wafer, during singulation of the MOSFET devices 100 and or during operation of the MOSFET devices 100 contaminations can be introduced along the surface of the body region 120 and can migrate toward the conducting channel induced in the body region 120 along the periphery of the gate insulator regions 115. Such contaminants in the conduction channel can deleteriously affect the performance of the MOSFET device 100. Accordingly, there is a continuing need for improved MOSFET devices and or methods of manufacturing the MOSFET devices.

SUMMARY OF THE INVENTION

The present technology may best be understood by referring to the following description and accompanying drawings that are used to illustrate embodiments of the present technology directed toward transistors with electrically active chip seal rings and method of manufacturing the same.

In one embodiment, a transistor can include a drain region, one or more gate regions, one or more source regions, one or more body regions, one or more gate insulator regions, and an electrically active chip seal ring. The one or more gate regions can be disposed in a core area of a substrate. The one or more body regions can be disposed between the one or more source regions and the drain region, proximate the one or more gale regions. The one or more gate insulator regions can be disposed between the one or more gate regions and the one or more source regions. The one or more gate insulator regions can also be disposed between the one or more gate regions and the one or more body regions. The one or more gate insulator regions can also be disposed between the one or more gate regions and the drain region. The electrically active chip seal ring region can be disposed in a periphery region surrounding the core region, and coupled to the one or more gate regions. In addition, at least a portion of a gate bus region can be integral to the electrically active chip seal ring region.

In another embodiment, a transistor can include a drain region, one or more gate regions, one or more source regions, one or more body regions, one or more gate insulator regions, one or more gate bus regions, and one or more dielectric layers. The one or more body regions can be disposed between the one or more source regions and the drain region, and disposed proximate the one or more gate regions. The one or more gate insulator regions can be disposed between the one or more gate regions and the one or more source regions, between the one or more gate regions and the one or more body regions, and between the one or more gate regions and the drain region. The gate bus region can be electrically coupled to the one or more gate regions and surrounding the structure of the one or more gate regions, one or more gate insulator regions and the one or more source regions. The one or more dielectric layers can be disposed above the one or more source regions, the one or more body regions and the one or more gate regions.

In another embodiment, a method of manufacturing a transistor can include forming a drill region on a drain region, forming a body region on the drift region, forming a plurality of gate trenches down through the body region, forming gate insulator regions in the plurality of gate trenches, forming gate regions in the plurality of gate trenches after forming the gate insulator regions, and forming a plurality of source regions in the body region adjacent the gate regions, wherein source regions are separated from the gate regions by the gate insulator regions and the source regions are separated from the optional drift region or the drain region by a portion of the body region. The method can further include forming a chip seal ring trench surrounding the plurality of gate regions and source regions, forming a chip seal ring insulator region in the chip seal ring trench, and forming a chip seal ring region in the chip seal ring trench after forming the chip seal ring insulator region. The chip seal ring can surround the plurality of gate regions and source regions. The chip seal ring can be electrically coupled to die gate regions.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which:

FIGS. 4A and 4B show a method of fabricating a MOSFET including an electrically active chip seal ring, in accordance with aspects of the present technology.

DETAILED DESCRIPTION OF THE INVENTION

Figure 1:
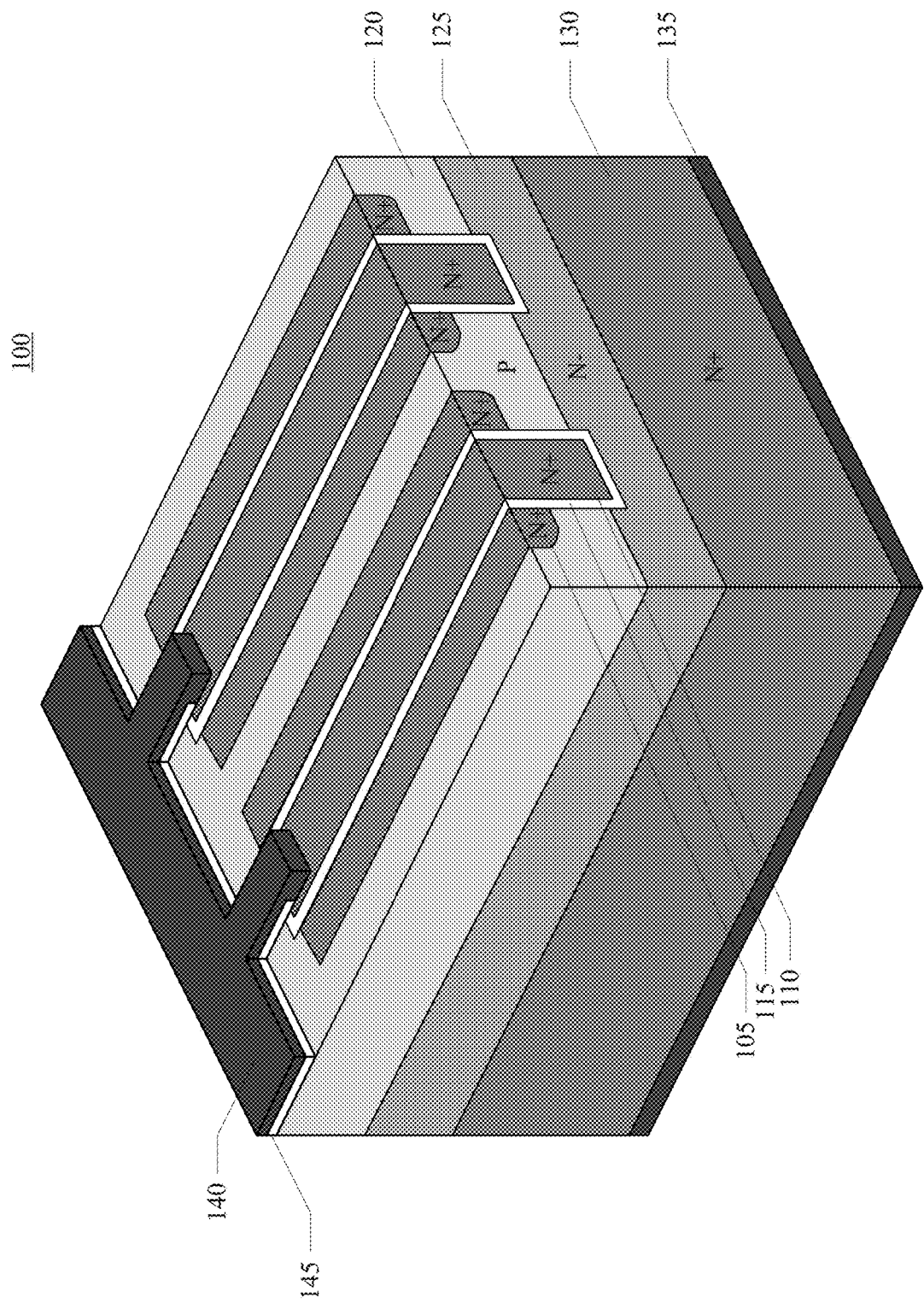
FIG. 1 shows a perspective view of an exemplary Metal-Oxide-Semiconductor Field Effect Transistor (MOSFET) according to the conventional art.

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous Specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically slated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

Figure 2:
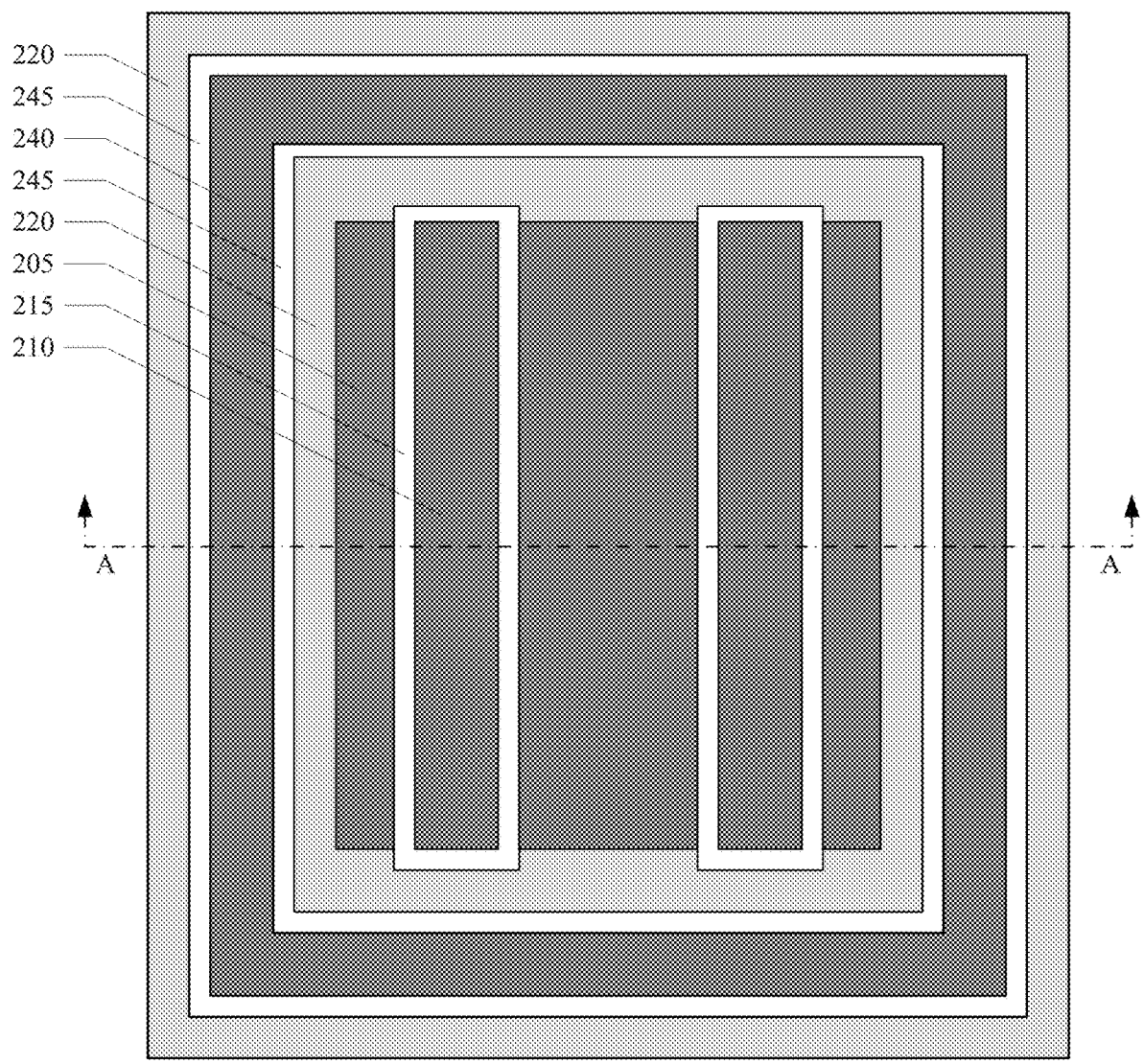
FIG. 2 shows an exemplary Metal-Oxide-Semiconductor Field Effect Transistor (MOSFET) including an electrically active chip seal ring, in accordance with aspects of the present technology.
Figure 3:
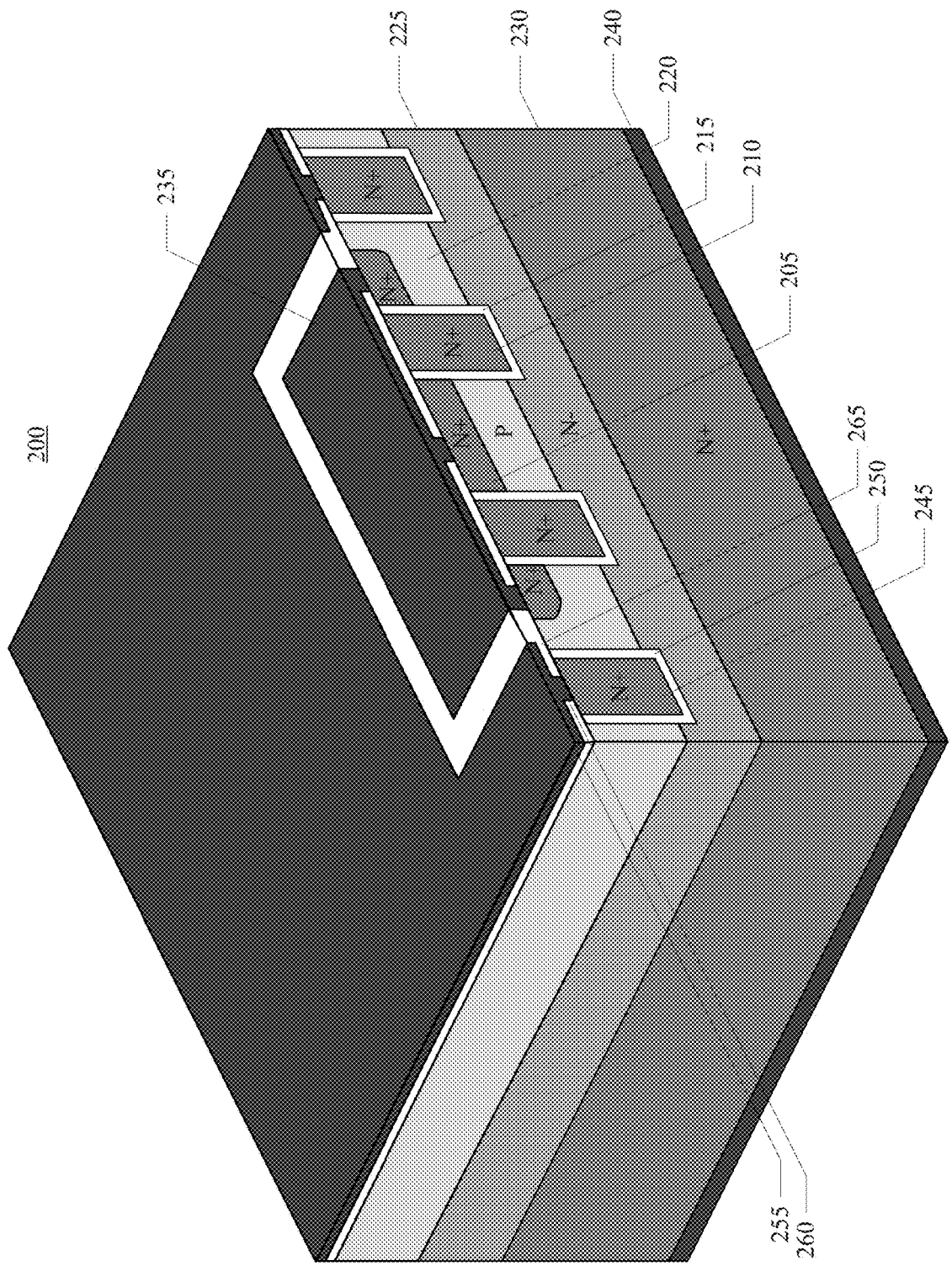
FIG. 3 shows an exemplary Metal-Oxide-Semiconductor Field Effect Transistor (MOSFET) including an electrically active chip seal ring, in accordance with aspects of the present technology.

Referring now to FIGS. 2 and 3, an exemplary Metal-Oxide-Semiconductor Field Effect Transistor (MOSFET) including an electrically active chip seal ring, in accordance with aspects of the present technology, is shown. In FIG. 2 a top plane view of the MOSFET is shown, in FIG. 3 an isometric view of the MOSFET is shown. The front right-side lace of the isometric view in FIG. 3 is a cutaway view corresponding to the cross-sectional view line A-A in FIG. 2.

The MOSFET 200 can include, but is not limited to, one or more source regions 205, one or more gate regions 210, one or more gate insulator regions 215, one or more body regions 220, one or more optional drift regions 225, one or more drain regions 230, one or more source/body contacts 235, one or more drain contacts 240, a chip seal ring region 245, a chip seal ring/body insulator region 250 and a chip seal ring gate region contact 255, 260.

In one implementation, the drift region 225 can be disposed between the drain region 230 and the body region 220. The plurality of source regions 205, the plurality of gate regions 210 and the plurality of gate insulator regions 215 can be disposed within the body region 220. The gate regions 210 can be formed as a plurality of parallel elongated structures (e.g., stripped cell structure). The gate insulator region 215 can surround the gate regions 210, separating the gate regions 210 from the source regions 205, the body region 220 and the drift region 225. Thus, the gate regions 210 are electrically isolated from the surrounding source regions 205, body region 220 and drift region 225 by the gate insulator regions 215. The source regions 205 can be formed along the periphery of the gate insulator regions 215. The source regions 205 can be separated from the drift region 225 and drain region 230 by the body region 220. The source regions 205 and the body region 220 can be electrically coupled together by one or more source/body contacts 235. The drain contact 240 can be disposed on the drain region 230.

The chip seal ring region 245 can be disposed around the periphery of the source regions 205, gate regions 210 and gate insulator regions 215 structure, thereby surrounding the parallel elongated structures of the source regions 205, gale regions 210 and gate insulator regions 215. The chip seal ring region 245 therefore encloses the active core area of the MOSFET 200. The chip seal ring region 245 can be electrically isolated front the surrounding body region 220 by the chip seal ring/body insulator region 250.

In one implementation, the chip seal ring region 245 can be electrically coupled to the gate regions 210 similar to the electrical coupling illustrated in FIG. 1. In another implementation, the chip soil ring region 245 can be electrically coupled to the gate regions by one or more contacts and or metalization layers as illustrated in FIG. 3. For example, a first metalization layer 255 may be disposed over the one or more source regions 205, one or more gale regions 210, one or more gate insulator regions 215, one or more body regions 220, and the chip seal ring region 245. A first insulator region 265 can be disposed between the first metalization layer 255 and the one or more source regions 205, one or more gate regions 210, one or more gate insulator regions 215, and one or more body regions 220. One or more contacts 260 can be disposed through the first insulator region 265 to couple die first metalization layer 255 to the one or more gate regions 210 and the chip seal ring region 245. The contacts can include one or more gate contacts (not shown) coupling corresponding gate regions 210 to the first metalization layer 255. In addition, a chip seal ring contact 260 extending around the chip seal ring region 245 can couple the chip seal ring region 245 to the first metalization layer 255. The chip seal ring contact 260 in combination with the first metalization layer 255 disposed over the one or more source regions 205, one or more gate regions 210, one or more gate insulator regions 215, one or more body regions 220, and the chip seal ring region 245 therefore further encloses the active core area of the MOSFET 200. In addition, the chip seal ring region 245, the chip seal ring contact 260, gate contacts (not shown) and chip seal ring contact 260 can also be utilized as a gate bus. Therefore, one or more portions of the gate bus can be integral with the chip seal ring region 245, the chip seal ring contact 260, gate contacts (not shown) and chip seal ring contact 260. Accordingly, the integral gate bus and chip seal ring region may not substantially increase the die area as compared to the conventional gate bus 140 as described above or other chip seal rings in accordance with the conventional art.

Although FIGS. 2 and 3 illustrates a MOSFET with two parallel elongated structures of source regions 205, gale regions 210 and gate insulator regions 215, commonly referred to as cell structures, it is appreciated that implementations of the MOSFET typically include many more such cell structures. Although FIGS. 2 and 3 illustrate a cell structure commonly referred to as a stripped cell structure, the electrically active chip seal ring, in accordance with aspects of the present technology, can also be utilized in any number of other cell structures, such as closed cell structures and the like.

In one implementation, the source regions 205 and the drain region 230 can be heavily n-doped (N+) semiconductor, such as silicon doped with phosphorous or arsenic. The drift region 225 can be moderately or lightly n-doped (N or N−) semiconductor, such as silicon doped with phosphorous or arsenic. The body region 220 can be p-doped (P) semiconductor, such as silicon doped with boron. The gate region 210 and chip seal ring 245 can be heavily n-doped (N+) semiconductor, such as polysilicon doped with phosphorous. The gate insulator regions 215 and chip seal ring/body insulator region 250 can be an insulator, such as silicon dioxide, or any other type of dielectric.

When the potential of the gate regions 210, with respect to the source regions 205, is increased above the threshold voltage of the MOSFET 200, a conducting channel can be induced in the body region 220 along the periphery of the gate insulator regions 215. The MOSFET 200 can then conduct current between the drain region 230 and the source regions 205. Accordingly, the MOSFET 200 is in its ON-state. In addition, the chip seal ring 245 is electrically coupled to the gate region 210 (referred to herein as an electrically active chip seal ring), and therefore can attract and or trap contaminants, impurities, defects and or the like to prevent them from migrating toward the conduction channel. For instance, the chip seal ring 240 can act to seal the active core of the MOSFET from intrusions in one or more dielectric layers formed above the source regions 205, gate regions 210 and gate insulator regions 215 cell structure. Therefore, the electrically active chip seal ring 245 can prevent and or reduce deleterious effects on the performance of the MOSFET 200 due to contaminants, impurities, defects and or the like that could otherwise migrate into the conduction channel of the MOSFET 200.

Figure 4A:
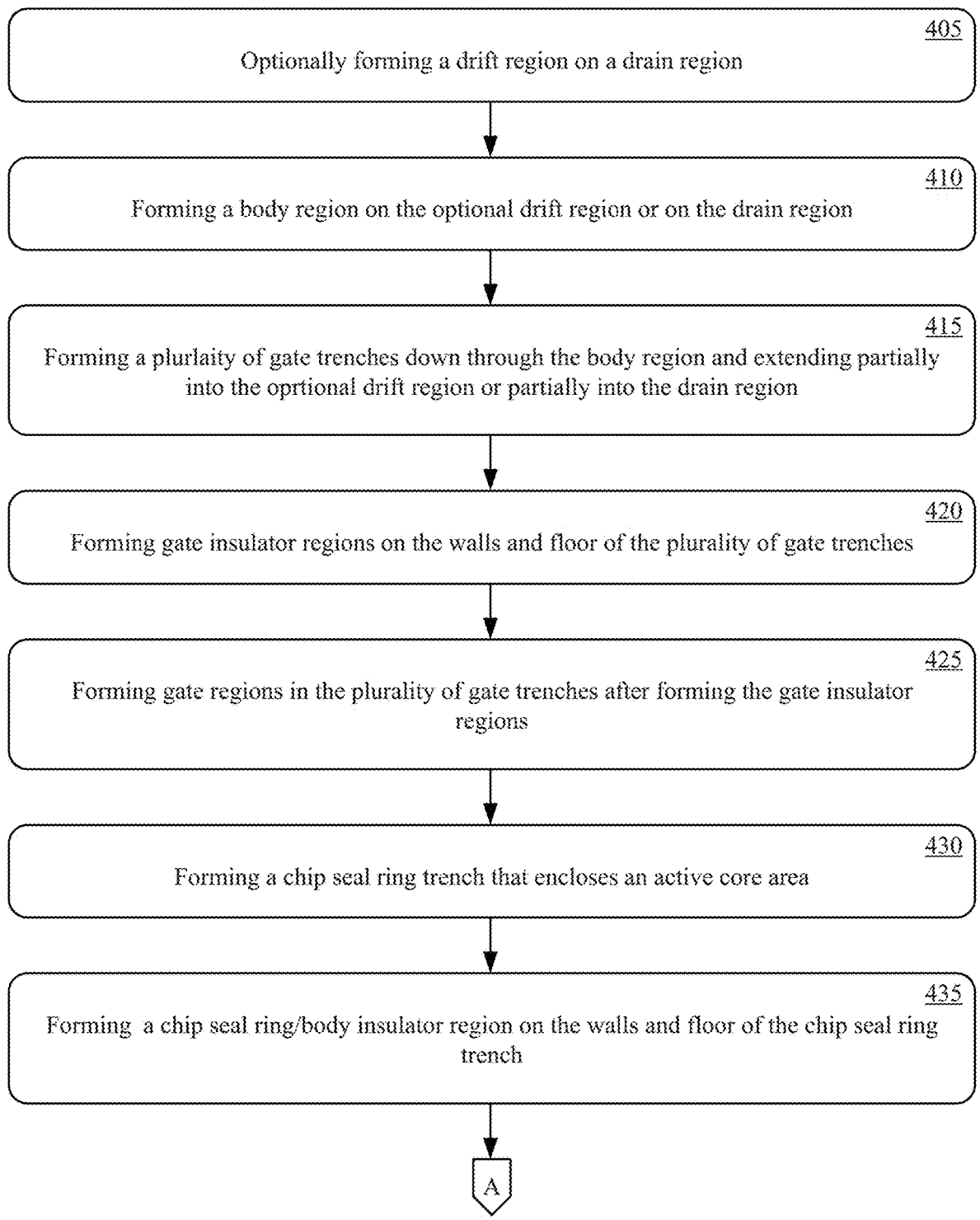

Referring now to FIGS. 4A and 4B, a method of fabricating a MOSFET including an electrically active chip seal ring, in accordance with aspects of the present technology, is shown. The method of fabricating the MOSFET including an electrically active chip seal ring can begin with various initial processes upon a semiconductor wafer, such as cleaning, depositing, doping, etching and or the like. In one implementation, the wafer can be a heavily n-doped (N+) semiconductor, such as silicon doped with phosphorous or arsenic that forms a drain region. At 405, a drift region can optionally be formed on the drain region. In one implementation, the drift region can be formed by epitaxially depositing a moderately or lightly n-doped (N or N−) semiconductor, such as silicon doped with phosphorous or arsenic on the drain region.

At 410, a body region can be formed on the option drift region, or on the drain region if a drift region is not included. In one implementation, a dopant such as boron can be implanted in an upper portion of the epitaxially deposited semiconductor layer to form a p-doped (P) semiconductor body region above the optional drift region. Alternatively, the boron dopant can be implanted in the upper portion of the drain substrate to form the body region above the drain region, if a drift region is not included.

At 415, a plurality of gate trenches can be formed through the body region. The gate trenches can extend partially into the optional drift region, or partially into the drain region of the drift region is not included. In one implementation, a gate trench mask can be formed on the body region. The portions of the body region exposed by the gate trench mask can then be selectively etched to form the plurality of gate trenches through the body region. In one implementation, the plurality of gate trenches can be substantially parallel elongated trenches disposed in a core area.

At 420, a gate insulator region can be formed in the plurality of gate trenches. In one implementation, the surface of the body region can be oxidized to form an oxide layer on the walls and floor of the gate trenches and the surface of the body region. At 425, gate regions can be formed in the plurality of gate trenches after forming the gate insulator regions. In one implementation, a heavily n-doped (N+) semiconductor, such as polysilicon doped with phosphorous or arsenic, can be deposited in the plurality of gate trenches and on the surface of the body region. Excess portions of the deposited semiconductor and the oxide layer formed over the surface of the body region can then be removed by etching until the portions of the deposited semiconductor and the oxide layer disposed in the gate trenches remain.

At 430, a chip seal ring trench can be formed in the body region surrounding the core area. In one implementation, a chip seal ring trench mask can be formed on the body region enclosing the core area including the plurality of gate regions, the gate insulator regions and the subsequently formed plurality of source regions. The portions of the body region exposed by the chip seal ring trench mask can then be selectively etched to form the chip seal ring trench in the body region.

At 435, a chip seal ring/body insulator region can be formed in the chip seal ring trench. In one implementation, the surface of the body region can be oxidized to form an oxide layer on the walls and floor of the chip seal ring trench and the surface of the body region. At 440, a chip seal ring region can be formed in the chip seal ring trench after forming the chip seal ring/body insulator region. In one implementation, a heavily n-doped (N+) semiconductor, such as polysilicon doped with phosphorous or arsenic, can be deposited in the chip seal ring trench and on the surface of the body region. Excess portions of the deposited semiconductor and the oxide layer formed over the surface of the body region can then be removed by etching until the portions of the deposited semiconductor and the oxide layer disposed in the chip seal ring trench remain At 445, a plurality of source regions can be formed in the body region adjacent the gate regions. The source regions can be separated from the gate regions by the gate insulator regions. The source regions can also be separated from the optional drift region or the drain region by a portion of the body region. In one implementation, a dopant such as phosphorous or arsenic can be implanted in an upper portion of the body region to form heavily n-doped (+N) semiconductor source regions.

At 450, an insulator region can be formed over the gate regions, the source regions and the body region. In one implementation, a dielectric layer can be deposited on the surface of the gate regions, the source regions and the body regions. At 455, a chip seal ring contact and gate contacts can be formed through the insulator regions. The chip seal ring contact can extend around the chip seal ring region and be electrically coupled to the chip seal ring region. The gate contacts can be electrically coupled to corresponding gate regions. At 460, a metalization layer can be formed over the insulator region and electrically coupled to the chip seal ring contact and the gale contacts. In one implementation, a contact opening mask can be formed on the dielectric layer. The portions of the dielectric layer exposed by the contact opening mask can be selectively etched to form an opening extending around the chip seal ring region and openings extending to corresponding gale regions. After removing the contact mask, conductive layer can be deposited over the dielectric layer and filing the opening extending around the chip seal ring region and the openings extending to corresponding gate regions. The chip seal ring region and the conductive layer coupled to and extending around the chip seal ring region can form an integral chip seal ring and gate bus.

The method of fabricating the MOSFET can continue with various subsequent processes upon the wafer, such as cleaning, depositing, doping, etching and or the like. The subsequent process can form various other structures of the MOSFET, such as contacts, traces, vias, encapsulation layers and the like. The additional subsequent process are not necessary for an understanding of aspects of the present technology and therefore are not further described herein.

The chip seal ring region electrically coupled to the gate region advantageously acts to seal the active core area from intrusions of contaminants, impurities, defects and or the like. In addition, the integral chip seal ring region and chip seal ring/gate coupling regions forming an integral chip seal ring and gate bus advantageously does not substantially increase the area of the periphery region.

Figure 5A:
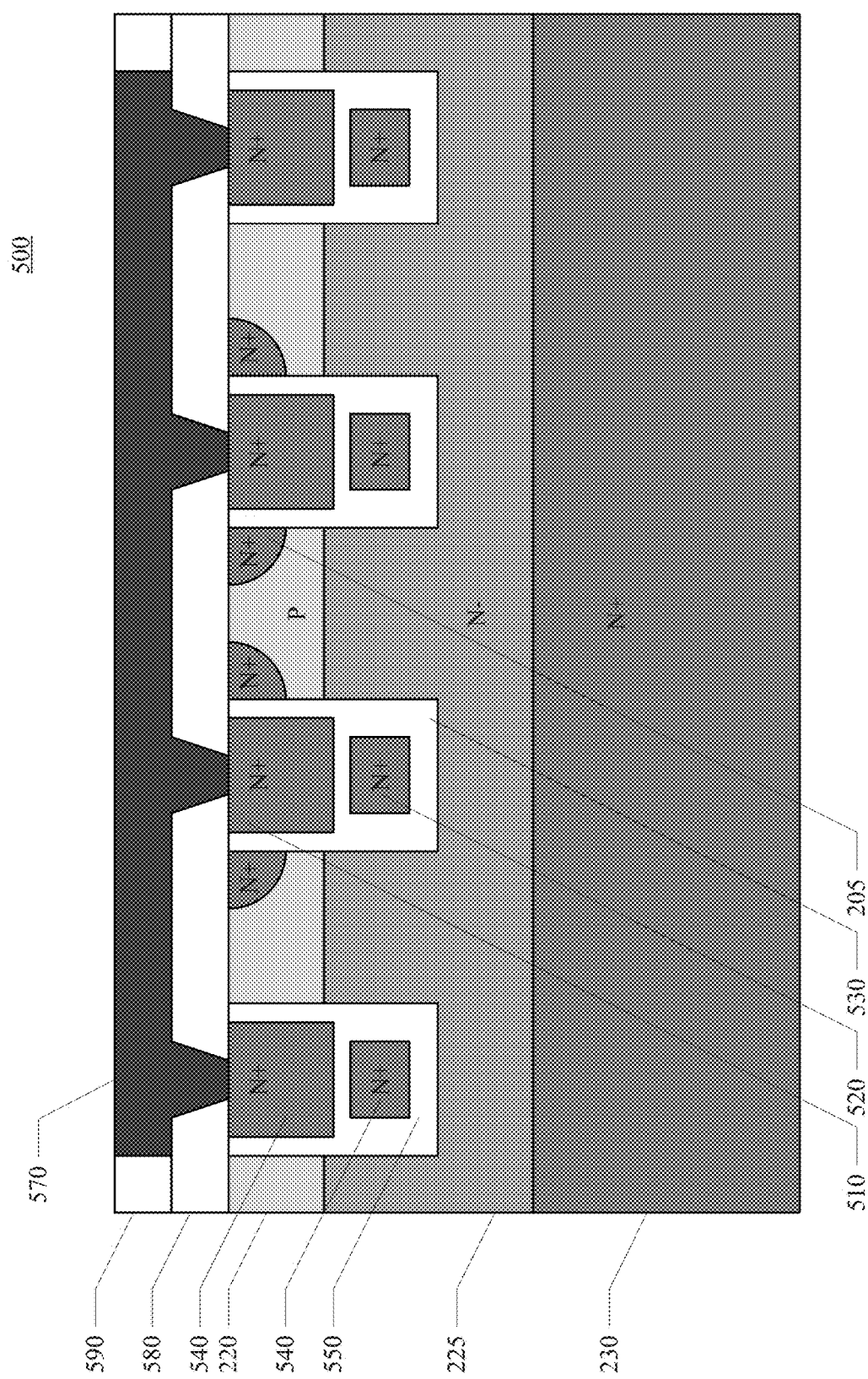
FIGS. 5A and 5B shows an exemplary Metal-Oxide-Semiconductor Field Effect Transistor (MOSFET) including an electrically active chip seal ring, in accordance with aspects of the present technology.
Figure 5B:
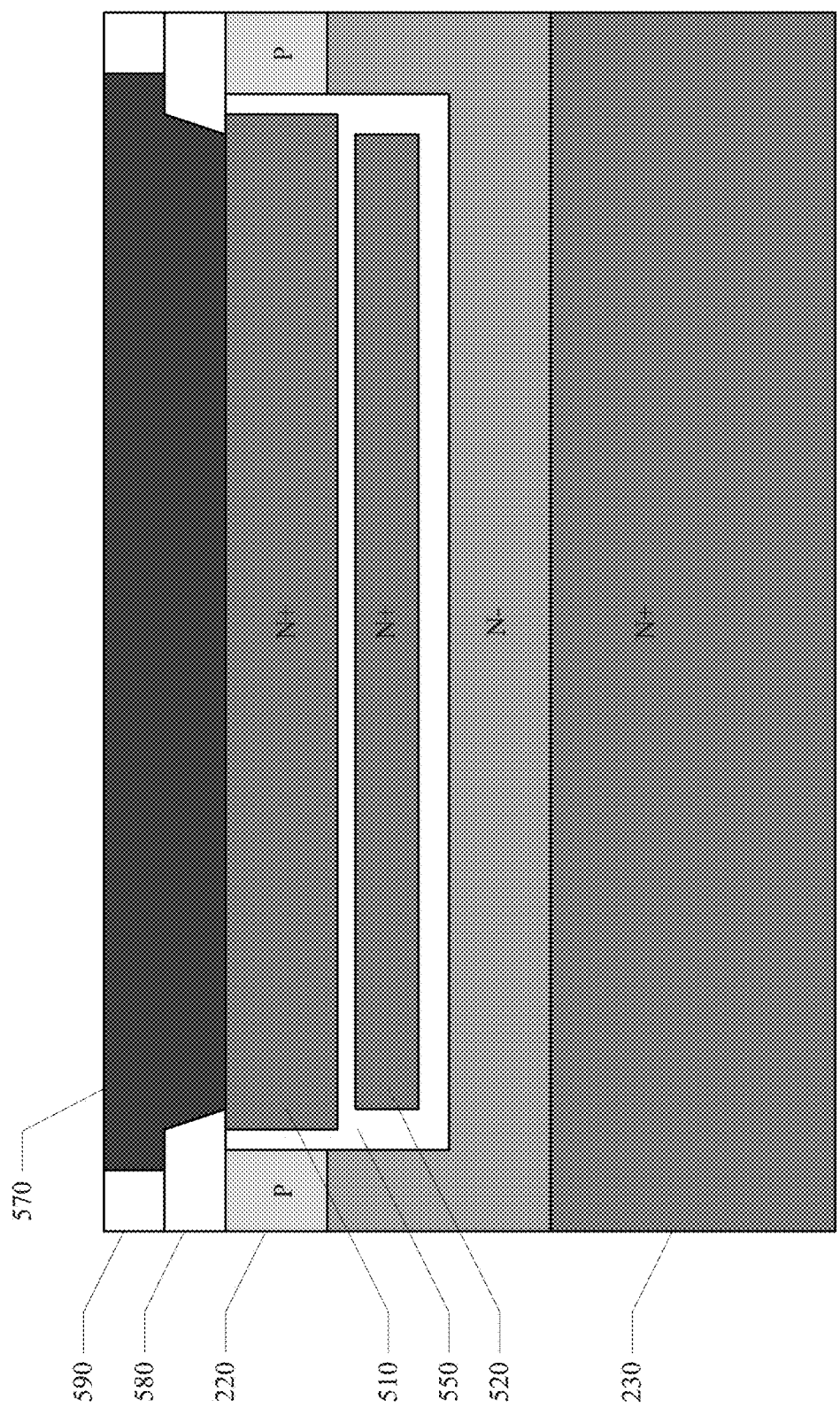

Referring now to FIGS. 5A and 5B, an exemplary MOSFET including an electrically active chip seal ring, in accordance with aspects of the present technology, is shown. FIG. 5A illustrates a cross cut view of the MOSFET 500 cut across a plurality of gate regions 510. FIG. 5B illustrates a cross cut view of the MOSFET 500 cut along the length of a gate region 510. The MOSFET 500 can include, but is not limited to, one or more source regions 205, one or more body regions 220, one or more optional drift regions 225, and one or more drain regions 230. The source regions 205, body regions 220, drift region 225 and drain region 230 are substantially similar to those described above with reference to FIGS. 2 and 3.

The MOSFET 500 can also include one or more split gate regions 510, 520, and one or more gate insulator regions 530. In one implementation, the first of the split gate regions 510 can be disposed between the source regions 205, the body regions 220 and the optional drill region 225. The first of the split gate regions 510 can be electrically coupled to the gate terminal of the MOSFET 500. The second of the split gate regions 520 can be disposed between the drift regions 225, the first gate regions 510 and the drain region 230. The second of the split gate regions 520 can be electrically coupled (not shown) to the source regions 205 and the body region 220. The gate insulator regions 530 can be disposed about the split gate regions 510, 520. Accordingly, the gale insulator 530 can electrically isolate the first of the gate regions 510 from the second of the gate regions 520. In addition, the gate insulator regions 530 can electrically isolate the first of the split gate regions 510 and the second of the split gate regions 520 from the body regions 220, the drift region 225 and the source regions 205. The split gate regions 510, 520 can be heavily n-doped (N+) semiconductor, such as polysilicon doped with phosphorous. The gate insulator region 530 can be one or more layers of an insulator, such as silicon dioxide, or any other dielectric.

The MOSFET 500 can further include one or more one or more split chip seal ring regions 540, 550, and one or more chip seal ring/body insulator region 560. In one implementation, the second of the chip seal ring region 550 can be disposed between the first of second chip seal ring region 540 and the drift region 225 or drain region 230. The chip seal ring/body insulator region 560 can be disposed about the split chip seal ring regions 540, 550. Accordingly, the chip seal ring/body insulator region 560 can electrically isolate the first of the chip seal ring region 540 from the second chip seal ring region 550. In addition, the chip seal ring/body insulator region 560 can electrically isolate the first of the chip seal ring region 540 and the second of the chip seal ring region 550 from the body regions 220 and drift region 225. In one implementation, the first of the split chip seal ring regions 540 can be electrically coupled to the first of the split gate regions 510. The second of the split chip seal ring regions 550 can be electrically coupled (not shown) to the source regions 205 and the body region 220. The split chip seal ring regions 540, 550 can be heavily n-doped (N+) semiconductor, such as polysilicon doped with phosphorous. The chip seal ring/body insulator region 560 can be one or more layers of an insulator, such as silicon dioxide, or any other type of dielectric.

The split chip seal ring regions 540, 550 can enclose the active core area of the MOSFET 500. The first of the split chip seal ring regions 540 can be electrically coupled to the first of the gate regions 510 by the one or more chip seal ring/gate coupling regions 570. In one implementation, the one or more chip seal ring/gate coupling regions 570 can include a chip seal ring contact portion coupled to and extending around the first of the split chip seal ring region 540, 550, and one or more gate contact portions coupled to the first of the split gate regions 510. The chip seal ring/gate coupling regions 570 can be electrically isolated from the body region 220 and source regions 205 by the one or more insulator regions 580, 590. The chip seal ring/gate coupling regions 570 can further enclose the active core area of the MOSFET 500. The split chip seal ring regions 540, 550 and chip seal ring/gate coupling regions 570 can also be utilized as a portion of a gate bus. Therefore, one or more portions of the gate bus can be integral with the split chip seal ring regions 540, 550 and chip seal ring/gate coupling regions 570. Accordingly, the integral gate bus and split chip seal ring regions 540, 550 may not substantially increase the die area as compared to the conventional gate bus 140 as described above or other chip seal rings in accordance with the conventional art.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A transistor comprising:
   a drain region disposed in a substrate;
   a drift region disposed on the drain region;
   one or more gate regions disposed in a core area of the substrate, and disposed down into the drift region;
   one or more source regions disposed proximate the one or more gate regions;
   one or more body regions disposed between the one or more source regions and the drift region, and disposed proximate the one or more gate regions;
   one or more gate insulator regions disposed between the one or more gate regions and the one or more source regions, between the one or more gate regions and the one or more body regions, between the one or more gate regions and the drift region, and between the one or more gate regions and the drain region;
   an electrically active chip seal ring region disposed down into the drift region in a periphery region surrounding the core area;
   one or more dielectric layers disposed over the one or more gate regions, the one or more source regions, the one or more body regions, the one or more gate insulator regions and the electrically active ship seal ring region;
   a metilization layer disposed over the one or more dielectric layers;
   a chip seal ring contact extending through the one or more dielectric layers between the metallization layer to the electrically active ship seal ring region, and extending around the electrically active chip seal ring region; and
   one or more gate contacts extending through the one or more dielectric layers between the metalization layer and the one or more gate regions.

2. The transistor of claim 1, wherein:
   the drain region comprises a heavily n-doped semiconductor;
   the drift region comprises a moderate or lightly n-doped semiconductor;
   the one or more body regions comprise a moderately p-doped semiconductor;
   the one or more source regions comprise a heavily n-doped semiconductor; and
   the electrically active chip seal ring region comprises a heavily n-doped semiconductor.

3. The transistor of claim 1, wherein electrically active chip seal ring region, the metalization layer and the chip seal ring extending around the electrically active chip seal ring region enclose the one or more gate regions and one or more source regions.

4. The transistor of claim 1, further comprising a chip seal ring insulator region disposed between the electrically active chip seal ring region and the one or more body regions.

5. The transistor of claim 4, further comprising a first electrically active chip seal ring region disposed between a second electrically active chip seal ring region and the drain region, wherein the chip seal ring insulator region is further disposed between the first and second electrically active chip seal ring regions and the one or more body regions.

6. The transistor of claim 4, wherein the body region extends continuously between the chip seal ring insulator region and the one or more gate insulator regions.

7. A transistor comprising:
a drain region;
a drift region disposed on the drain region;
one or more gate regions disposed down into the drift region;
one or more source regions;
one or more body regions disposed between the one or more source regions and the drift region, and disposed proximate the one or more gate regions;
one or more gate insulator regions disposed between the one or more gate regions and the one or more source regions, between the one or more gate regions and the one or more body regions, between the one or more gate regions and the drift region, and between the one or more gate regions and the drain region;
an electrically active chip seal ring region disposed down into the drift region and surrounding the structure of the one or more gate region, one or more gate insulator regions and the one or more source regions,
a chip seal ring insulator region disposed between the electrically active chip seal ring region and the body region and between the electrically active chip seal ring and the drift region;
first metalization layer disposed over the one or more gate regions, the one or more source region, the one or more body regions, the one or more gate insulator regions and the electrically active chip seal ring region;
a chip seal ring contact extending around the electrically active chip seal ring region, and coupled between the first metalization layer and the electrically active chip seal ring region;
one or more gate contact coupled between the first metilization layer and the one or more gate regions; and
one or more dielectric layers disposed between the first metalization layer and the one or more source regions, between the first metalization layer and the one or more body regions, and between the first metalization layer and the one or more gate regions.

8. The transistor of claim 7, wherein the chip seal ring contact, the first metalization layer and the electrically active chip seal ring region are configured to seal the structure of the one or more gate regions, one or more gate insulator regions and the one or more source regions from contaminants migrating in through the one or more dielectric layers.

9. The transistor of claim 7, wherein:
the drain region comprises a heavily n-doped semiconductor;
the drift region comprises a moderate or lightly n-doped semiconductor;
the one or more body regions comprise a moderately p-doped semiconductor;
the one or more source regions comprise a heavily n-doped semiconductor;
the one or more gate insulator regions comprise an oxide or dielectric; and
the electrically active chip seal tin region comprises a heavily n-doped semiconductor.

10. The transistor of claim 7, wherein the one or more body regions extend continuously between the one or more gate insulator regions and the chip seal ring insulator region.

* * * * *